(12) United States Patent
Kim (10) Patent No.: US 12,062,568 B2
(45) Date of Patent: Aug. 13, 2024

(54) SIC EDGE RING

(71) Applicant: TOKAI CARBON KOREA CO., LTD, Gyeonggi-do (KR)

(72) Inventor: Kyoung Jun Kim, Gyeonggi-do (KR)

(73) Assignee: TOKAI CARBON KOREA CO., LTD, Gyeonggi-Do (KR)

( * ) Notice: Subject to any disclaimer, the term of this patent is extended or adjusted under 35 U.S.C. 154(b) by 411 days.

(21) Appl. No.: 17/604,320

(22) PCT Filed: Mar. 11, 2020

(86) PCT No.: PCT/KR2020/003341
§ 371 (c)(1),
(2) Date: Oct. 15, 2021

(87) PCT Pub. No.: WO2020/213836
PCT Pub. Date: Oct. 22, 2020

(65) Prior Publication Data
US 2022/0246462 A1 Aug. 4, 2022

(30) Foreign Application Priority Data
Apr. 16, 2019 (KR) .................. 10-2019-0044499

(51) Int. Cl.
*H01L 21/687* (2006.01)
*H01J 37/32* (2006.01)
(Continued)

(52) U.S. Cl.
CPC .. *H01L 21/68721* (2013.01); *H01J 37/32642* (2013.01); *H01L 21/02167* (2013.01);
(Continued)

(58) Field of Classification Search
CPC ......... H01L 21/68721; H01L 21/02167; H01L 21/02274; H01L 21/3065; H01L 21/31116; H01J 37/32642
See application file for complete search history.

(56) References Cited

U.S. PATENT DOCUMENTS

| 2004/0173319 A1 | 9/2004 | Suzuki et al. |
| 2013/0157067 A1 | 6/2013 | Kawamoto et al. |

(Continued)

FOREIGN PATENT DOCUMENTS

| JP | 2004079983 A | 3/2004 |
| JP | 2006-253200 A | 9/2006 |

(Continued)

OTHER PUBLICATIONS

International Search Report for corresponding PCT/KR2020/003341 mailed Jun. 12, 2020 2 Pages.

*Primary Examiner* — Victor A Mandala
*Assistant Examiner* — Colleen E Snow
(74) *Attorney, Agent, or Firm* — Armstrong Teasdale LLP (57) ABSTRACT

Described herein are edge ring among components for manufacturing semiconductors used in a semiconductor manufacturing process. The SiC edge ring includes: a first deposition part having a plasma-damaged portion and a non-damaged portion and including SiC; and a second deposition part formed on the first deposition part and including SiC, wherein a boundary between the damaged portion of the first deposition part and the second deposition part includes an uneven surface.

16 Claims, 6 Drawing Sheets

(51) Int. Cl.
  *H01L 21/02* (2006.01)
  *H01L 21/3065* (2006.01)
  *H01L 21/311* (2006.01)

(52) U.S. Cl.
  CPC .... *H01L 21/02274* (2013.01); *H01L 21/3065* (2013.01); *H01L 21/31116* (2013.01); *H01J 2237/332* (2013.01); *H01J 2237/334* (2013.01)

(56) References Cited

U.S. PATENT DOCUMENTS

| | | |
|---|---|---|
| 2013/0284375 A1 | 10/2013 | Nagayama et al. |
| 2016/0343547 A1 | 11/2016 | Lim et al. |
| 2019/0206686 A1* | 7/2019 | Kim ................. H01L 21/02529 |
| 2020/0063269 A1 | 2/2020 | Lee |

FOREIGN PATENT DOCUMENTS

| | | |
|---|---|---|
| JP | 2011-018894 A | 1/2011 |
| JP | 2012049220 A | 3/2012 |
| KR | 10-2013-0094802 A | 8/2013 |
| KR | 10-1593921 B1 | 2/2016 |
| KR | 10-1671671 B1 | 11/2016 |
| KR | 10-1814201 B1 | 1/2018 |
| KR | 20180020912 A | 2/2018 |
| KR | 10-2018-0071695 A | 6/2018 |
| TW | 201800596 A | 1/2018 |
| WO | 99/41773 A1 | 8/1999 |

* cited by examiner

SIC EDGE RING

CROSS-REFERENCE TO RELATED APPLICATIONS

This application is a National Phase Application of PCT International Application No. PCT/KR2020/003341, having an International Filing Date of Mar. 11, 2020, which claims priority to Korean Patent Application No. 10-2019-0044499, filed Apr. 16, 2019, each of which is hereby incorporated by reference herein in its entirety.

TECHNICAL FIELD

The following description relates to an edge ring which is one of components for manufacturing semiconductors used in a semiconductor manufacturing process, and more particularly, to a SiC edge ring which is formed to be used for a semiconductor manufacturing process again by regenerating a damaged edge ring of a dry etching device using plasma.

BACKGROUND ART

Generally, a plasma treatment technique used in a semiconductor manufacturing process is one of dry etching processes, in which a target is etched using gas. The plasma treatment technique follows a process of physically and chemically removing a wafer surface by injecting an etching gas into a reaction vessel, ionizing the etching gas, and then accelerating the etching gas onto the wafer surface. This method is widely used because it is easy to control the etching, has a high productivity, and forms fine patterns of several tens of nanometers.

As one of variables to be considered for uniform etching of the plasma treatment technique, uniform application of high frequency onto a surface of a target may be considered. Uniform application of high frequency is an essential element to form uniform energy distribution on the entire wafer surface in an actual etching process. This is not achieved only by adjusting an output of the high frequency, but may greatly depend on a shape of a stage and an anode as a high frequency electrode and an edge ring which functions to actually fix the wafer.

The edge ring suppresses the diffusion of the plasma in a reaction chamber in a plasma treatment device under a severe condition in which the plasma is present and limits the plasma in the vicinity of the wafer in which the etching process is performed. Therefore, the edge ring is always exposed to the plasma so that a surface thereof is etched by positive ions in the plasma. Accordingly, when the edge ring is not replaced at an appropriate period, an amount of etching by-products resulting from the etching of the edge ring is increased in the reaction chamber so that the precision of the etching process is degraded and the quality of the product is lowered. Therefore, the damaged edge ring which is etched needs to be replaced at a regular cycle and the replaced edge ring is completely disposed as it is.

DISCLOSURE OF THE INVENTION

Technical Goals

According to an aspect of the present invention, in order to solve the above-mentioned problems, an object of the present invention provides an edge ring which is a regenerated component for manufacturing semiconductors to contribute environment conservation by reducing industrial wastes generated by disposing the component for manufacturing semiconductors, such as a replaced edge ring, and reducing a production cost of the final semiconductor product.

An aspect of the present invention is to provide a method for minimizing a cost consumed for the regenerating process of the edge ring which is a component for manufacturing semiconductors by omitting and simplifying an unnecessary process as much as possible.

Further, an aspect of the present invention is to provide a SiC edge ring in which a plurality of layers is stacked to stack a plurality of SiC layers using an effective method during a deposition process of the edge ring and suppress a continuous growth of an abnormal tissue so that a quality is uniform even at a boundary between layers to avoid a separation and a concern about pores or cracks. However, technical problems to be solved by the present invention are not limited to the above-mentioned technical problems, and other technical problems, which are not mentioned above, may be clearly understood by those skilled in the art from the following descriptions.

Technical Solutions

A SiC edge ring of the present invention includes: a first deposition part having a plasma-damaged portion and a non-damaged portion and including SiC; and a second deposition part formed on the first deposition part and including SiC, in which a boundary between the damaged portion of the first deposition part and the second deposition part includes an uneven surface.

According to an exemplary embodiment of the present invention, the uneven surface may be formed by plasma-etching.

According to an exemplary embodiment of the present invention, a height difference between a highest point and a lowest point of the uneven surface formed from a portion having the same height before being exposed to the plasma to be damaged, in the uneven surface, may be 0.5 mm to 3 mm.

According to an exemplary embodiment of the present invention, a surface roughness of the uneven surface may be 0.1 μm to 2.5 μm.

According to an exemplary embodiment of the present invention, the first deposition part and the second deposition part may have different transmittances.

According to an exemplary embodiment of the present invention, the first deposition part may include at least any one selected from the group consisting of graphite, reaction sintered SiC, normal-pressure sintered SiC, hot press SiC, recrystallized SiC, CVD SiC, TaC, and YaC.

According to an exemplary embodiment of the present invention, a difference in the transmittances between the first deposition part and the second deposition part may be larger than a difference in transmittances between a plurality of stacked layers in the second deposition part.

According to an exemplary embodiment of the present invention, the first deposition part includes a plurality of stacked layers and the transmittance may gradually change at the boundary between the plurality of stacked layers of the first deposition part.

According to an exemplary embodiment of the present invention, a third deposition part formed on the second deposition part is further included and the boundary surface between the second deposition part and the third deposition part may include an uneven surface.

According to an exemplary embodiment of the present invention, the first deposition part, the second deposition part, and the third deposition part have different transmittances, a third deposition part formed on the second deposition part is further included, and a cross-section of the regenerated SiC edge ring includes a section in which the boundary line between the first deposition part and the second deposition part and the boundary line between the second deposition part and the third deposition part are parallel to each other.

According to an exemplary embodiment of the present invention, the first deposition part may include at least two separated structures.

According to an exemplary embodiment of the present invention, the second deposition part may include at least two separated structures.

According to an exemplary embodiment of the present invention, the at least two separated structures may have the same transmittance.

According to an exemplary embodiment of the present invention, the first deposition part forms one structure which is not separated, a cross-section of the first deposition part incudes a first region to a third region from an outer side surface of the SiC edge ring to an inner side surface, and an average thickness t1 of the first region, an average thickness t2 of the second region, and an average thickness t3 of the third region may be t1>t3>t2.

According to an exemplary embodiment of the present invention, an average thickness of the second deposition part may be 0.5 mm to 3 mm.

According to an exemplary embodiment of the present invention, the uneven surface may be subjected to a surface processing treatment before forming the second deposition part.

Effects

A SiC edge ring according to an exemplary embodiment of the present invention is capable of regenerating an edge ring which is one of a regenerated component for manufacturing semiconductors with an efficient method by omitting an unnecessary process. By doing this, the SiC edge ring which is one of components for manufacturing semiconductors which is etched by the plasma to be replaced and then disposed in the related art is not disposed, but a deposition part is formed to be regenerated as a new component to be reused.

A SiC edge ring according to another exemplary embodiment of the present disclosure may implement a process production efficiency which is equal to or better than the replacement of the SiC edge ring with a new product at a relatively low cost by forming a new deposition part in a component which is replaced and then disposed.

Ultimately, according to the exemplary embodiments of the present invention, finally, a production cost of the semiconductor products may be saved, and mass production of industrial wastes may be reduced.

BEST MODE FOR CARRYING OUT THE INVENTION

Hereinafter, exemplary embodiments will be described in detail with reference to the accompanying drawings. In each of the drawings, like reference numerals denote like elements.

Exemplary embodiments to be described below may be modified in various ways. It should be understood that exemplary embodiments to be described below are not intended to limit the examples, but include all changes, equivalents, and alternatives to them.

Terms used in the exemplary embodiment are used only to describe a specific exemplary embodiment, but are not intended to limit the exemplary embodiment. A singular form may include a plural form if there is no clearly opposite meaning in the context. In this specification, it should be understood that term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

If it is not contrarily defined, all terms used herein including technological or scientific terms have the same meaning as those generally understood by a person with ordinary skill in the art. Terms defined in generally used dictionary shall be construed that they have meanings matching those in the context of a related art, and shall not be construed in ideal or excessively formal meanings unless they are clearly defined in the present application.

Further, in description with reference to accompanying drawings, the same components are denoted by the same reference numerals regardless of the reference numeral and a duplicated description thereof will be omitted. In description of an exemplary embodiment, if it is determined that detailed description for a related art may unnecessarily blur the gist of the exemplary embodiment, the detailed description will be omitted.

Figure 1:
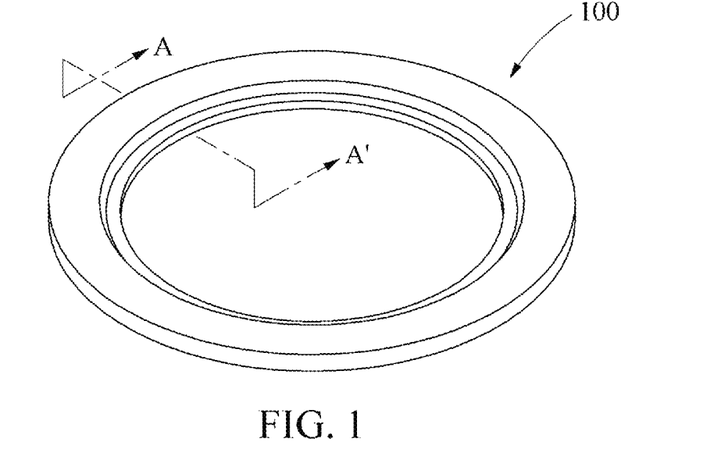
FIG. 1 is a perspective view of a SiC edge ring used in a plasma treatment device of a semiconductor manufacturing process.

FIG. 1 is a perspective view of a SiC edge ring used in a plasma treatment device of a semiconductor manufacturing process.

In FIG. 1, one shape 100 of various structures according to a process device product, of a SiC edge ring which is one of components for manufacturing semiconductors used in a plasma treatment device of a semiconductor manufacturing process is illustrated. A cross-section of the edge ring has a stepped structure between an upper surface and a seating surface and has a structure including a step surface connecting the steps. In another example of the edge ring, a surface connecting the steps may be formed to have a vertical structure. The seating surface may refer to a seating surface of an object to be processed and an example of the object to be processed may be a wafer.

Figure 2:
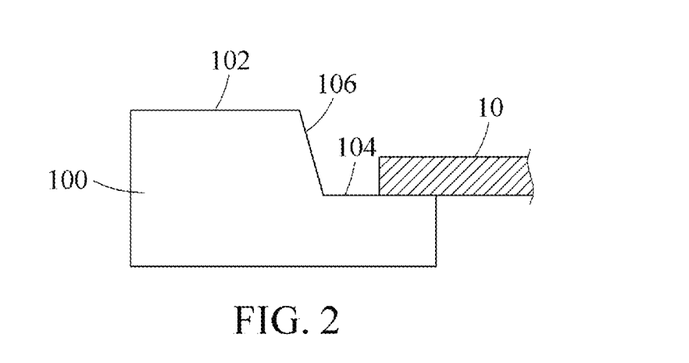
FIG. 2 is a cross-sectional view illustrating a structure in which a wafer is mounted in a SiC edge ring which is one of components for manufacturing semiconductors in a plasma treatment device of a semiconductor manufacturing process.

FIG. 2 is a cross-sectional view illustrating a structure in which a wafer 10 is mounted on a SiC edge ring 100 which is one of components for manufacturing semiconductors in a plasma treatment device of a semiconductor manufacturing process.

At this time, the wafer may be mounted on the entire seating surface 104 or a part of the seating surface 104 of the edge ring depending on a structure of a process device. Thereafter, the mounted wafer and the edge ring are exposed to the plasma in a chamber of a plasma treatment device to be etched. At this time, a portion which is exposed to the external plasma may be etched. Specifically, in the case of the edge ring, portions of the upper surface 102, the step surface 106, and the seating surface 104 which are not covered by the wafer may be intensively etched. Accordingly, components for manufacturing semiconductors exposed to the plasma, in the plasma treatment device, such as the edge ring, are damaged and required to be periodically replaced. An object of the present invention is to form a new deposition part in the edge ring, among the components for manufacturing semiconductors, which are periodically replaced and then disposed, thereby achieving the same effect as buying a new product at a reduced cost.

Figure 3:
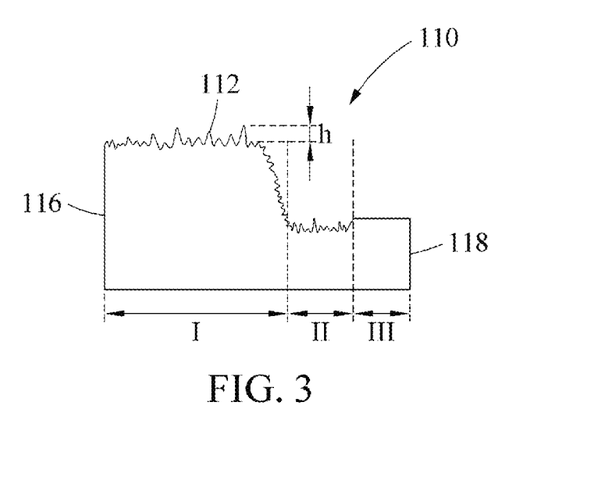
FIG. 3 is a cross-sectional view illustrating a schematic structure of a first deposition part of a SiC edge ring having a plasma-damaged portion and a non-damaged portion, according to an exemplary embodiment of the present invention.

FIG. 3 is a cross-sectional view illustrating a schematic structure of a first deposition part 110 of a SiC edge ring having a plasma-damaged portion and a non-damaged portion, according to an exemplary embodiment of the present invention. Referring to FIG. 3, it may be confirmed that the damaged portion 112 is formed in portions of the upper surface, the step surface, and the seating surface of the SiC edge ring which are not covered by the wafer. As illustrated in FIG. 3, in some cases, an outer side surface 116 and an inner side surface 118 of the SiC edge ring may include non-damaged portions.

In the present invention, as illustrated in FIG. 3, for the sake of convenience, the first deposition part of the SiC edge ring is divided into a first region (section I) including an upper surface with a damaged portion, a second region (section II) including a damaged portion of a seating surface, and a third region (section III) including a non-damaged portion of the seating surface.

The SiC edge ring of the present invention includes a first deposition part having a plasma-damaged portion and a non-damaged portion and including SiC and a second deposition part formed on the first deposition part and including SiC. A boundary between the damaged portion of the first deposition part and the second deposition part includes an uneven surface.

The first deposition part according to an aspect to the present invention may be a part of a structure which is first manufactured as an edge ring by a chemical vapor deposition method. The first deposition part according to an aspect of the present invention may include a damaged portion which is etched by the plasma and a non-damaged portion which is not etched by the plasma and maintains an original shape and a processing surface.

In the meantime, as the first deposition part according to one aspect of the present invention, during a process of laminating a deposition layer to be regenerated on the initially manufactured edge ring and processing from the bottom surface to be standardized, an edge ring structure which is initially manufactured is entirely processed to disappear and a deposition layer which is stacked for the purpose of regeneration may be included as the first deposition part. That is, the first deposition part of the present invention may include a part of a layer which is deposited on the edge ring which is initially etched by the plasma.

The second deposition part may be formed on the first deposition part. The second deposition part according to an aspect of the present invention may be stacked on the damaged portion of the first deposition part which is etched by the plasma in the plasma treatment device and the non-damaged portion as it is.

At this time, the boundary between the damaged portion of the first deposition part and the second deposition part may include an uneven surface. In the present invention, the uneven surface refers to a surface of the edge ring which is damaged by the plasma to be irregularly etched. The uneven surface may be a bumpy surface with unevenness or a surface formed by the initially standardized structure from which some fragments are separated. The uneven surface is used as a terminology referring to an edge ring surface including all side surfaces which are used in the plasma treatment device to be etched by the plasma to be uneven as compared with the initially manufactured edge ring product.

In the meantime, according to an aspect of the present invention, the first deposition part, the second deposition, or both the first deposition part and the second deposition part may include SiC and additionally include the other components including TaC and hydrocarbon. Hydrocarbon has a chemical formula of $C_xH_y$ and x is an integer of 1 or larger and y is an integer of 2 or larger. Further, the edge ring may have a structure in which a silicon layer is coated on a silicon carbide substrate.

Further, the first deposition part and the second deposition part may include the same component as a wafer to be produced. When a regeneration part includes a component which is totally different from that of the wafer to be manufactured, if the component of the semiconductor manufacturing device is damaged by the plasma, the component is leaked to the outside to contaminate the wafer. Constituent elements and component distributions of the first deposition part and the second deposition part of the SiC edge ring may be the same or different. That is, the non-regeneration part, the regeneration part, or both the non-regeneration part and the regeneration part include additional components such as TaC and hydrocarbon as well as SiC so that a curvature strength may be significantly increased and a higher erosion resistance against the plasma may be ensured.

According to an exemplary embodiment of the present invention, the uneven surface may be formed by the plasma etching.

According to an exemplary embodiment of the present invention, a height difference (h in FIG. 3) between a highest point and a lowest point of the uneven surface formed from a portion having the same height before being exposed to the plasma to be damaged may be 0.01 mm to 3 mm (substantially 3 mm or lower). For example, the height difference may be 0.5 mm to 3 mm.

According to an exemplary embodiment of the present invention, it is understood that a surface roughness of the uneven surface may be 0.1 μm to 2.5 μm.

As an example, it is understood that a surface roughness of the uneven surface immediately after etching the surface by the plasma may be 0.05 μm to 0.3 μm. Further, as another example, the uneven surface may be formed to have a surface roughness of 0.1 μm to 2.5 μm by processing a part of the damaged surface after etching the surface by the plasma.

According to an example, even though a separate processing step is not included, when the first deposition part is formed to have a surface roughness of 0.1 μm to 2.5 μm, the second deposition part may form a uniform deposition layer on a surface layer of the first deposition part.

According to the exemplary embodiment of the present invention, the first deposition part and the second deposition part may have different transmittances.

In the present invention, the transmittance refers to a degree that light passes through a material layer and corresponds to a value obtained by dividing the intensity of light passing through the material layer by an intensity of incident light for the material layer. The transmittance may be measured by various methods and may be measured with a distance between a specimen and a light source which is 7 cm or less by manufacturing a specimen having a thickness of 3 mm and using a light source with a luminous intensity of 150 Lux or higher. Since the transmittance varies depending on a thickness, a light source, and a distance between the specimen and the light source, the transmittance may be considered as a relative value with respect to the same thickness. Accordingly, the transmittance corresponds to a unique characteristic of the material so that even though materials have the same ingredient and composition, the materials may have different transmittances depending on a crystal structure and morphology.

The first deposition part and the second deposition part of the SiC edge ring provided by an aspect of the present invention include the same components, but may have different transmittances.

Figure 4:
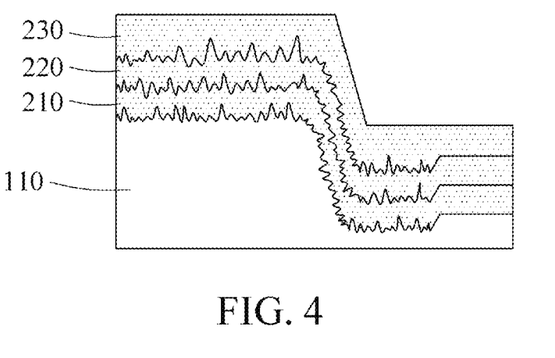
FIG. 4 is a cross-sectional view illustrating a schematic structure in which a second deposition part is formed on a first deposition part of a SiC edge ring according to an exemplary embodiment of the present invention and a third deposition part formed by a plurality of layers is formed on the second deposition part.

FIG. 4 is a cross-sectional view illustrating a schematic structure in which a second deposition part 210 is formed on a first deposition part 110 of a SiC edge ring according to an exemplary embodiment of the present invention and a third deposition part formed by a plurality of layers 220 and 230 is formed on the second deposition part.

As illustrated in FIG. 4, the third deposition part may be formed by a plurality of layers. That is, according to an aspect of the present invention, a first third-deposition part 220 is formed on the second deposition part and a second third-deposition part 230 is formed on the first third-deposition part. At this time, after forming the first third-deposition part to be standardized as an edge ring, the standardized edge ring may be used in the plasma treatment device.

At this time, a part of the surface of the first third-deposition part is etched and the second third-deposition part is formed on the first third-deposition part with a damaged portion to ensure the SiC edge ring including the third deposition part having a plurality of layers provided by an aspect of the present invention.

According to an exemplary embodiment of the present invention, the first deposition part includes at least any one selected from the group consisting of graphite, reaction sintered SiC, normal-pressure sintered SiC, hot press SiC, recrystallized SiC, CVD SiC, TaC, and YaC.

According to an aspect of the present invention, if a material of the first deposition part (a non-regeneration part) is applicable to a component used for equipment for manufacturing semiconductors, a type of the material is not specifically limited. As an example, one or more of a carbon material including graphite which is a material applicable as a base material, various SiC materials having an excellent plasma resistance, various TaC or YaC materials may be included.

According to an aspect of the present invention, the second deposition part (regeneration part) may include SiC or TaC or both SiC and TaC to have an excellent plasma resistance.

According to an exemplary embodiment of the present invention, the difference in transmittances between the first deposition part and the second deposition part may be larger than a difference in transmittances between the plurality of stacked layers in the second deposition part.

According to an exemplary embodiment of the present invention, the first deposition part includes a plurality of stacked layers and transmittance may gradually change at the boundary between the plurality of stacked layers of the first deposition part.

According to an example of the present invention, when the first deposition part is formed by a plurality of layers, a characteristic in that the transmittance may gradually change at the boundary between stacked layers of the first deposition part may be implemented.

According to an exemplary embodiment of the present invention, a third deposition part formed on the second deposition part is further included and a boundary surface between the second deposition part and the third deposition part may include an uneven surface.

According to an aspect of the present invention, the third deposition part may be further formed on the second deposition part. At this time, a boundary surface between the second deposition part and the third deposition part may include an uneven surface because a partial surface of the second deposition part is etched by the plasma after forming the second deposition part as described above. That is, the SiC edge ring according to an aspect of the present invention is standardized after forming the second deposition part on the first deposition part to be manufactured as an edge ring and is used in the plasma treatment device so that after etching at least a part of the second deposition part, the third deposition part may be formed on the second deposition part including a partially damaged portion which is etched.

According to one exemplary embodiment of the present invention, the first deposition part, the second deposition part, and the third deposition part may have different transmittances, respectively.

Just as the first deposition part and the second deposition part have different transmittances, the first deposition part, the second deposition part, and the third deposition may also have different transmittances, respectively. The third deposition part may have the same constituent element as the first deposition part and the second deposition part, but have a different transmittance therefrom.

Further, according to one exemplary embodiment of the present invention, the third deposition part formed on the second deposition part is further included and in a cross-section of the regenerated SiC edge ring, a boundary line between the first deposition part and the second deposition part and a boundary line between the second deposition part and the third deposition part may include sections which are parallel to each other.

The parallel sections may be formed in an area of each deposition part which is not damaged by the plasma. Above a portion of the first deposition part which is not to damaged by the plasma, the second deposition part may be formed to form an upper surface parallel to the boundary. Further, after forming the second deposition part, even though the second deposition part is exposed to the plasma, the third deposition part may be formed above a portion which is not damaged by the plasma to form an upper surface parallel to the boundary.

As illustrated in FIG. 4, a partial surface of the SiC edge ring including a non-damaged portion which is covered by a surface of the wafer from the plasma forms a flat surface. The boundary lines of the cross-sections of the SiC edge ring among the first deposition part, the second deposition part, and the third deposition part stacked on this portion may be parallel to each other. Accordingly, the SiC edge ring provided by an aspect of the present invention may include a section in which the boundary line between the first deposition part and the second deposition part and the boundary line between the second deposition part and the third deposition part are parallel to each other. When the third deposition part is formed by a plurality of layers, the boundary surfaces between the plurality of layers of the third deposition part may include a section in which the boundary surfaces are parallel.

According to an aspect of the present invention, the boundary surface between the first deposition part and the second deposition part, the boundary surface between the second deposition part and the third deposition part, and the boundary surfaces between the layers of the third deposition layer which is formed by the plurality of layers may have include portions in which the boundary surfaces are parallel.

According to an aspect of the present invention, after forming the deposition part on the SiC edge ring, a task for standardizing the edge ring to be used in the plasma treatment device may be performed. For example, the standardizing task performed in the present invention may process a bottom surface of the SiC edge ring on which the deposition part is formed. That is, according to an aspect of the present invention, the deposition part is stacked above the edge ring so that the thickness is increased. Therefore, the bottom surface is processed from the bottom as much as the increased thickness to be standardized in accordance with a size of the product applicable to the plasma treatment device.

During this process, the edge ring etched by the plasma may form a structure of the damaged edge ring (first deposition part) 110 as illustrated in FIG. 3. According to an aspect of the present invention, the plurality of deposition parts forms layers to be placed on the edge ring as illustrated in FIG. 4. Next, when the edge ring is processed from the bottom surface as much as a predetermined thickness to be standardized, a cross-sectional structure as illustrated in FIGS. 5A and 5B may be formed in the standardized edge ring.

Figure 5A:
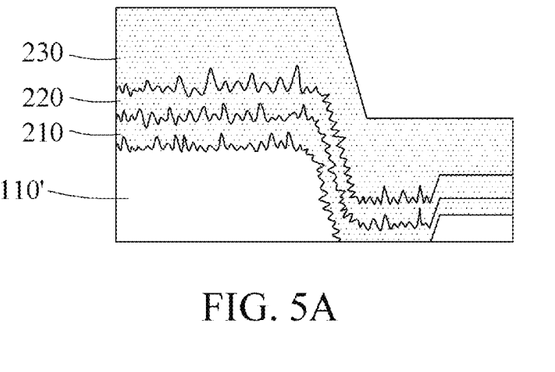
FIGS. 5A and 5B are cross-sectional views illustrating a schematic structure in which a second deposition part is formed on a first deposition part of a SiC edge ring according to another exemplary embodiment of the present invention and a third deposition part formed by a plurality of layers is formed on the second deposition part.
Figure 5B:
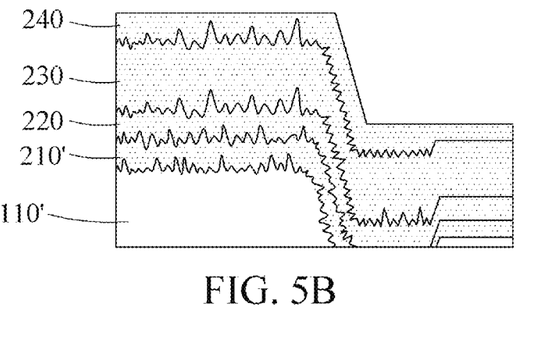

FIGS. 5A and 5B are cross-sectional views illustrating a schematic structure in which a second deposition part is formed on a first deposition part of a SiC edge ring according to another exemplary embodiment of the present invention and a third deposition part formed by a plurality of layers is formed on the second deposition part.

According to one exemplary embodiment of the present disclosure, the first deposition part may include at least two separated structures.

FIG. 5A illustrates a cross-sectional view of a SiC edge ring in which the first deposition part 110 is divided into two separated structures 110' by processing the SiC edge ring from the bottom surface as much as a predetermined thickness.

In the meantime, referring to FIG. 5A, the third deposition part is formed by two layers 220 and 230 and in this case, each layer of the third deposition part does not need to have the same deposition thickness. According to an aspect of the present invention, in consideration of the degree of processing from the bottom surface, if necessary, a layer 230 of the third deposition part which is much thicker than the other layer 220 of the third deposition part may be formed.

According to one exemplary embodiment of the present disclosure, the second deposition part 210 may include at least two separated structures 210'.

FIG. 5B illustrates a cross-sectional view of a SiC edge ring in which not only the first deposition part 110, but also the second deposition part 210 is divided into two separated structures by processing the SiC edge ring from the bottom surface as much as a predetermined thickness.

In the meantime, in FIG. 5B, the third deposition part is formed by three layers 220, 230, and 240 and in this case, the deposition thickness of each layer may be formed as needed in consideration of the processing degree from the bottom surface.

According to an exemplary embodiment of the present disclosure, at least two separated structures may have the same transmittance.

The structures deposited in the same deposition condition of the same chamber may form the same transmittance. That is, the deposition structures which are simultaneously formed from the same raw gas may have the same light transmittance.

A separated first deposition layer of FIG. 5A and separated first deposition layer and second deposition layer of FIG. 5B correspond to a structure in which deposition layers are deposited as one connected structure and then processed from the bottom surface with a predetermined thickness to be separated. Therefore, the separated first deposition layer of FIG. 5A and the separated first deposition layer and second deposition layer of FIG. 5B may form the same transmittance, respectively.

According to an exemplary embodiment of the present invention, the first deposition part forms one structure which is not separated, and a cross-section of the first deposition part includes first to third regions from an outer side surface to an inner side surface of the SiC edge ring. An average thickness t1 of the first region, an average thickness t2 of the second region, and an average thickness t3 of the third region may be t1>t3>t2.

In FIG. 3, the first region to third region of the SiC edge ring according to an example of the present disclosure are divided. For the sake of convention, the cross-section of the first deposition part of the SiC edge ring is divided into a first region (section I) including an upper surface with a damaged portion, a second region (section II) including a damaged portion of a seating surface, and a third region (section III)

including a non-damaged portion of the seating surface. In some cases, the first region may include a step surface which connects an upper surface and a seating surface. At this time, according to an aspect of the present invention, when it is assumed that average thicknesses of the respective regions are t1 to t3, the relationship of t1 to t3 may be t1>t3>t2.

According to an exemplary embodiment of the present invention, an average thickness of the second deposition part may be 0.5 mm to 3 mm.

In an example, an average thickness of the second deposition part may be 0.7 mm to 2.5 mm.

According to an aspect of the present invention, during the process of forming the second deposition part, it may be important to form the second deposition part to have an appropriate thickness. When the regeneration part is formed to be too thin, the entire regeneration part is etched by the plasma so that the damaged portion of the non-generation part therebelow may be exposed. This may be a direct cause of lowering a quality of a semiconductor product produced by the plasma treatment technique. Further, when the regeneration part is formed to be too thick, raw materials which are deposited to form the regeneration part are wasteful and the cost and efforts for the processing are increased to finally increase a unit price of the semiconductor product and may deteriorate the production efficiency. Therefore, in an aspect of the present invention, it may be important to appropriately control the thickness of the regeneration part.

In consideration of an aspect that the edge ring which needs to be replaced in the general plasma treatment device is etched by approximately 0.5 mm, as it is confirmed from various experiments according to an aspect of the present invention, the average thickness of the second deposition part is desirably 0.5 mm to 3 mm.

According to an exemplary embodiment of the present invention, the uneven surface may be subjected to a surface processing treatment before forming the second deposition part.

Hereinafter, a manufacturing method of a SiC edge ring provided by one exemplary embodiment of the present invention will be described.

The SiC edge ring of the present invention is manufactured by a method including a step of preparing an edge ring including a plasma-damaged portion and a non-damaged portion, a step of masking a part of the prepared SiC edge ring, a step of forming a regeneration part by performing a chemical vapor deposition method on the partially masked SiC edge ring, and a step of removing the masking and standardizing the SiC edge ring in which the regeneration part is formed. The regeneration part described herein may be the second deposition part or the third deposition part of the present invention and in some cases, the first deposition part may also be included in the regeneration part described herein.

The manufacturing method of the SiC edge ring to be described below may be applied to all the components which are required to be periodically replaced, after being exposed to the plasma to be etched in the plasma treatment device for manufacturing the semiconductor products.

Figure 6A:
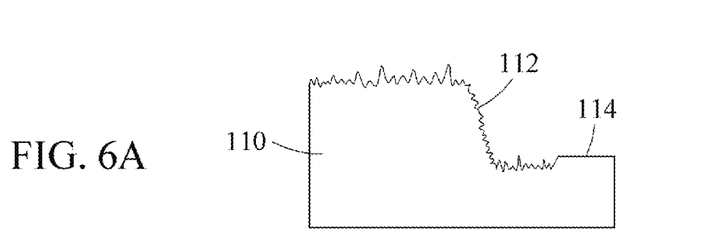
FIG. 6 is a cross-sectional process chart schematically illustrating a process of forming a second deposition part on a first deposition part of a SiC edge ring, according to an exemplary embodiment of the present invention.
Figure 6B:
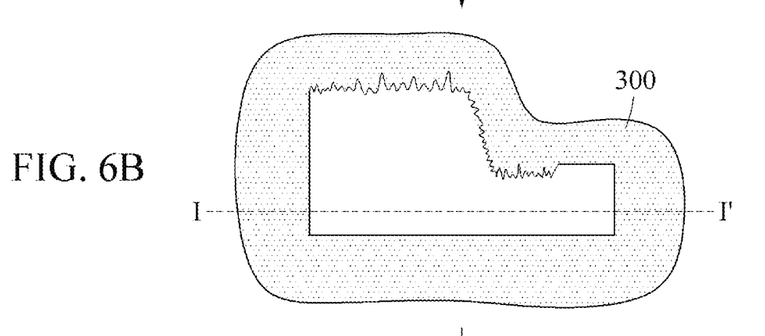
Figure 6C:
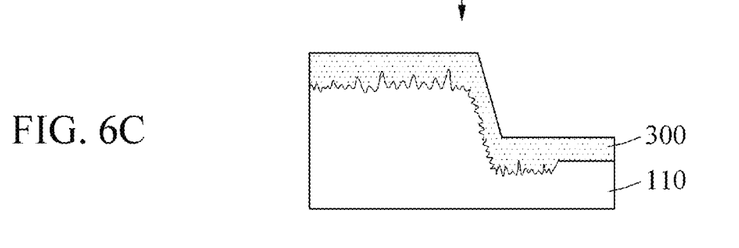

FIG. 6 is a cross-sectional process chart schematically illustrating a process of forming a second deposition part on a first deposition part of a SiC edge ring, according to an exemplary embodiment of the present invention.

As illustrated in FIG. 6, according to an exemplary embodiment of the present invention, without including the masking step, the second deposition part may be formed immediately on the first deposition part of the SiC edge ring.

FIG. 7 is a cross-sectional process chart schematically illustrating a process of forming a second deposition part on a first deposition part of a SiC edge ring, including a masking step, according to an exemplary embodiment of the present invention.

In FIGS. 6 and 7, a process of forming the second deposition part prior to forming the third deposition part according to an exemplary embodiment of the present disclosure is illustrated.

Hereinafter, a step of forming the second deposition part on the first deposition part provided by one exemplary embodiment of the present invention by a cross-sectional structure of the SiC edge ring illustrated in FIG. 7 will be described.

Figure 7A:
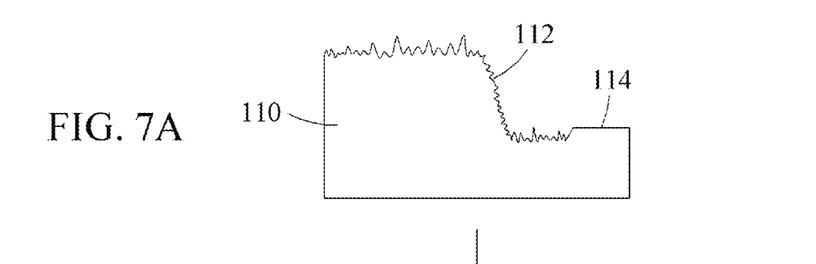
FIG. 7 is a cross-sectional process chart schematically illustrating a process of forming a second deposition part on a first deposition part of a SiC edge ring, including a masking step, according to an exemplary embodiment of the present invention.

FIG. 7A illustrates a step of preparing the SiC edge ring including a plasma-damaged portion and a non-damaged portion.

Figure 7B:
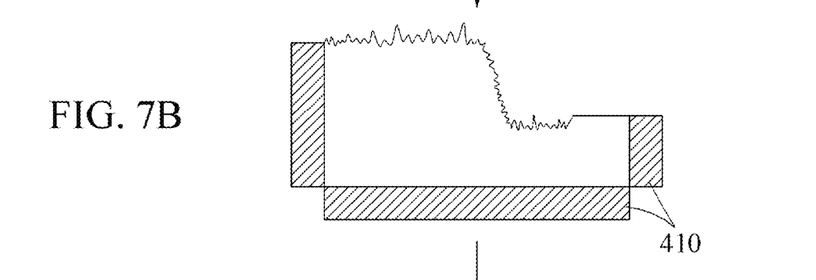

FIG. 7A illustrates, as an example of the SiC edge ring, a cross-section of the damaged edge ring (first deposition part) 110 including a damaged portion 112 etched by the plasma in a dry etching device and a non-damaged portion 114 which is not exposed to the plasma so that it is not etched. In FIG. 7A, as compared with the edge ring of FIG. 2 before being damaged, the damaged portion 112 which is etched by the plasma may be formed on an upper surface, a step surface, and a part of a seating surface which is not covered by the wafer. The remaining part 114 of the seating surface is covered by the wafer to be protected from the plasma to form a non-damaged portion. FIG. 7B illustrates a step of masking (410) a part of the prepared SiC edge ring.

In the masking step, the masking may be formed in a region including the non-damaged portion during the deposition process by the chemical vapor deposition method. This is to minimize the processing after deposition by minimizing the deposition of a raw gas in a portion where the deposition is not necessary during the step of forming the regeneration part (second deposition part). That is, the masking step is performed to improve the efficiency of the process of manufacturing the SiC edge ring of the present invention.

At this time, the component of the regeneration part includes a material which is difficult to be processed, such as SiC or TaC so that it may be very important to minimize a direct processing area of the regeneration part during the process of performing the standardizing process to ensure the productivity of the product. According to an aspect of the present invention, in order to ensure the convenience of the subsequent standardizing step, a configuration for masking may be included in a portion including the non-damaged surface.

According to an example of the present invention, the masking step may include masking one or more non-damaged surfaces selected from the group consisting of a bottom surface, an outer side surface, and an inner side surface of the SiC edge ring. An edge ring which is an example of a component for manufacturing semiconductors of the present invention will be described as an example. As illustrated in FIG. 7B, the masking may be formed in one or more of the bottom surface, the outer side surface, and the inner side surface corresponding to the non-damaged portions.

As a material of the masking, in addition to the graphite material, a material which is more easily processed than the deposition material included in the regeneration part may be used. By doing this, in the subsequent processing step, the masking portion may be more easily processed as compared with the portion on which the deposition material is immediately formed. That is, the masking step is included in the manufacturing method of the SiC edge ring of the present invention so that it is advantageous to easily ensure a standardized surface of the regenerated SiC edge ring.

Figure 7C:
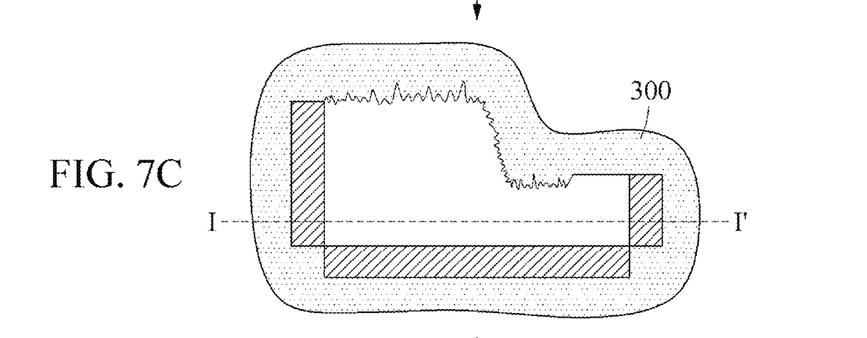

In FIG. 7C, a step of forming a regeneration part 300 (second deposition part) in the partially masked SiC edge ring by the chemical vapor deposition method is illustrated.

In this step, in a state that a partially masked SiC edge ring is mounted in the chamber, the raw gas is deposited on the mounted SiC edge ring by the chemical vapor deposition method, to form the regeneration part (second deposition part) on the first deposition part.

As illustrated in FIG. 7C, the damaged portion of the SiC edge ring etched by the plasma may include a surface which is not flat and even. At this time, according to the present invention, the regeneration part is formed without separately linear-processing the damaged portion of the SiC edge ring which is etched by the plasma to be flat. By doing this, according to an aspect of the present invention, a separate surface processing step which may be added is omitted so that the overall processing speed is increased and the cost for the regenerating process is saved.

As a specific method of the step of forming the regeneration part, a deposition temperature is 1000° C. to 1500° C., a film forming speed is 20 μm/hour to 400 μm/hour, and a residence time of the raw gas may be 7 seconds to 110 seconds. As illustrated in FIG. 7C, the SiC edge ring in which the regeneration part is formed is not processed to meet the specifications of the product required in the field.

Thereafter, a process of removing the masking and a process of standardizing may be performed on the SiC edge ring in which the regeneration part is formed. At this time, the process of removing the masking and the process of standardizing may be simultaneously performed or any one of two processes is performed first and then the remaining process may be formed. At this time, the process of removing the masking partially formed in the non-generation part may be performed more easily than the process of processing the regeneration part formed on the non-regeneration part to be standardized.

According to an example of the present invention, the step of standardizing the SiC edge ring in which the regeneration part is formed may include the standardizing of the thickness of the SiC edge ring by processing the bottom surface of the SiC edge ring. As the regeneration part is formed by deposition, the thickness of the SiC edge ring may be larger than a specification of the edge ring which his required in the field so that one of features of the present invention is to standardize the SiC edge ring by processing the bottom surface.

In FIG. 7C, a cutting line I-I' is illustrated. According to an aspect of the present invention, in the step of standardizing, the bottom surface of the SiC edge ring is processed as taken along the cutting line I-I' to standardize the SiC edge ring which is applicable to a semiconductor manufacturing device.

According to an aspect of the present invention, the process of removing the masking, a process of processing a deposition layer which forms the regeneration part, and a process of processing the bottom surface of the SiC edge ring may be separately performed or may be performed all together. According to one aspect of the present invention, as long as all the processes are performed, the order of performing the processes may be switched.

Another method for manufacturing a SiC edge ring of the present invention includes a step of preparing a SiC edge ring including a plasma-damaged portion and a non-damaged portion, a step of processing a bottom surface of the prepared SiC edge ring, a step of masking a part of the processed SiC edge ring, a step of forming a regeneration part by performing a chemical vapor deposition method on the partially masked SiC edge ring, and a step of removing the masking and standardizing the SiC edge ring in which the regeneration part is formed.

Figure 7D:
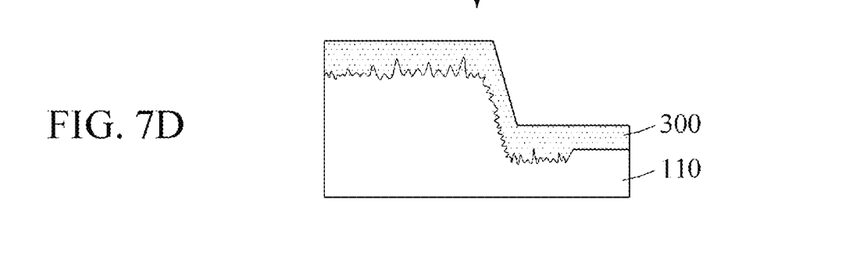
Figure 8A:
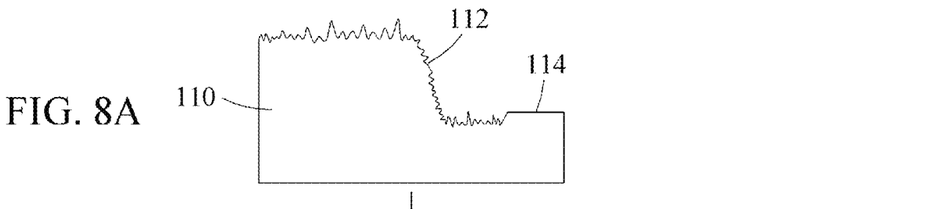
FIG. 8 is a cross-sectional process chart schematically illustrating a process of forming a second deposition part on a first deposition part of a SiC edge ring, according to another exemplary embodiment of the present invention.
Figure 8B:
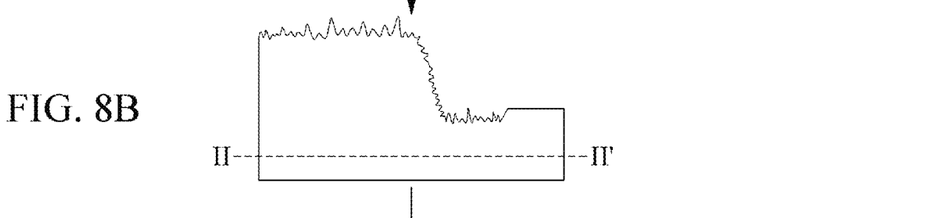
Figure 8C:
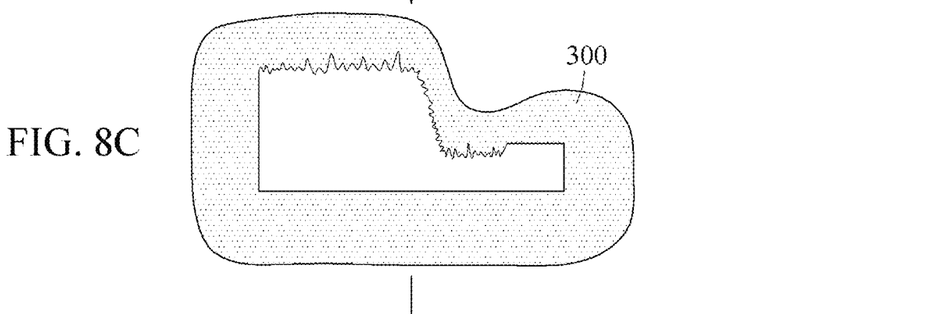
Figure 8D:
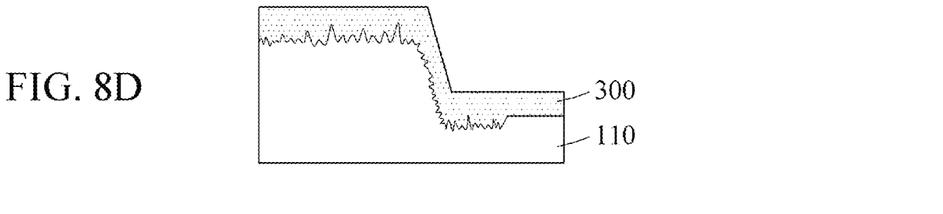

FIG. 7D illustrates a SiC edge ring in which the regeneration part on which the standardizing process is completed is formed.

FIG. 8 is a cross-sectional process chart schematically illustrating a process of forming a second deposition part on a first deposition part of a SiC edge ring, according to another exemplary embodiment of the present invention.

As illustrated in FIG. 8, according to another exemplary embodiment of the present invention, without including the masking step, the second deposition part may be formed immediately on the first deposition part of the SiC edge ring.

FIG. 9 is a cross-sectional process chart schematically illustrating a process of forming a second deposition part on a first deposition part of a SiC edge ring, including a masking step, according to another exemplary embodiment of the present invention.

Hereinafter, a step of forming the second deposition part on the first deposition part provided by another exemplary embodiment of the present invention by a cross-sectional structure of the SiC edge ring illustrated in FIG. 9 will be described.

Figure 9A:
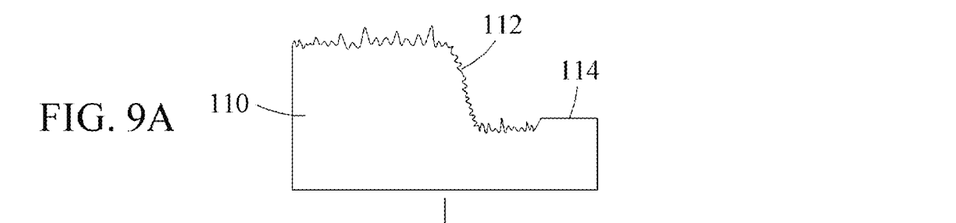
FIG. 9 is a cross-sectional process chart schematically illustrating a process of forming a second deposition part on a first deposition part of a SiC edge ring, including a masking step, according to another exemplary embodiment of the present invention.

FIG. 9A illustrates a step of preparing the SiC edge ring including a plasma-damaged portion and a non-damaged portion.

Figure 9B:
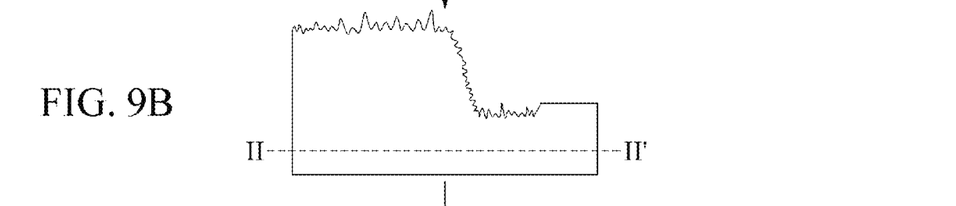

FIG. 9B illustrates a step of processing the bottom surface of the prepared SiC edge ring along the line II-II'. In the exemplary embodiment of the present disclosure, in consideration of the aspect that the standardization is necessary when the regeneration part is formed to have an increased thickness of the SiC edge ring, the bottom surface of the prepared SiC edge ring is processed first.

Figure 9C:
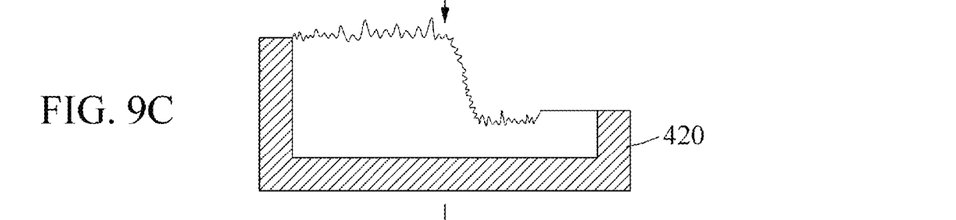

FIG. 9C illustrates a step of masking 420 a part of the prepared SiC edge ring. According to another exemplary embodiment of the present invention, a jig which supports the inner side surface and the outer side surface just like the jig illustrated in FIG. 7C and a jig which supports the bottom surface are separately formed or may be integrally formed as illustrated in FIG. 9C.

Figure 9D:
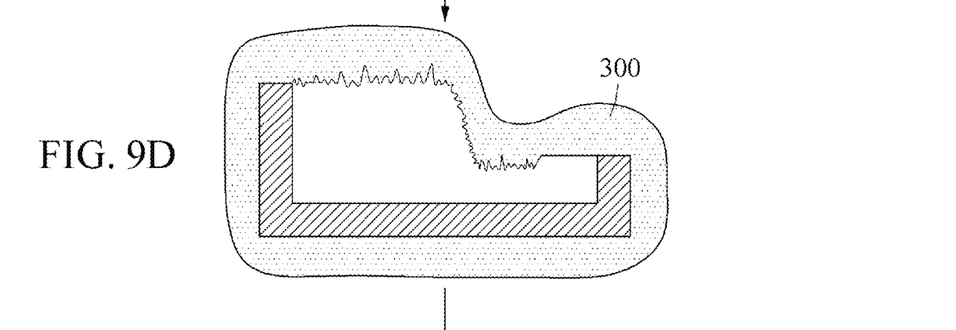

In FIG. 9D, a step of forming a regeneration part 300 in the partially masked SiC edge ring by the chemical vapor deposition method is illustrated.

Figure 9E:
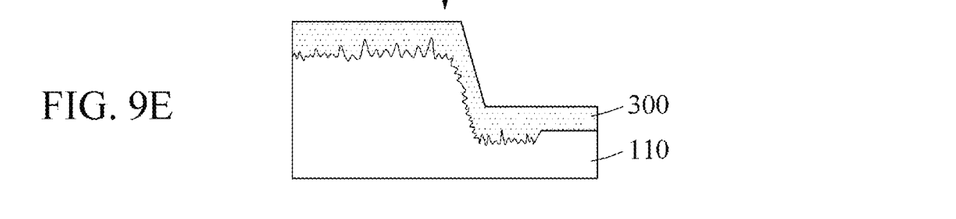

FIG. 9E illustrates a step of removing the masking and standardizing the SiC edge ring in which the regeneration part is formed. At this time, according to an aspect of the present invention, a step of processing the bottom surface of the prepared SiC edge ring along the line II-II' is previously performed so that the thickness of the SiC edge ring in which the regeneration part is formed is standardized to some extend so that so much effort for standardization process of this step is not required.

When the deposition is continuously performed during the deposition process of the second deposition part, abnormal tissues are continuously grown, which may result in a SiC edge ring with a poor quality. In this case, the SiC edge ring including the second deposition part may be formed to have a quality inferior to the SiC edge ring before being damaged by the plasma at first.

According to an example of the present invention, at the boundary of the stacked layers, interception of the growth of one or more abnormal tissues may be included. An abnormal tissue structure may be generated in each stacked layer due to impurities or a core formed by a homogeneous reaction. Therefore, it is very important to control the growth of the abnormal tissue structure during a process of manufacturing a product containing SiC by a chemical vapor deposition method. According to an aspect of the present invention, individual layers are stepwisely formed by intercepting the continuous deposition process of the related art so that the continuous growth of the abnormal crystal structure may be controlled.

According to an example of the present invention, when the second deposition part is formed with a plurality of layers, the continuous growth of the abnormal tissue at the boundary between layers is intercepted and the second deposition part with a uniform quality may be formed.

According to an example of the present invention, when the stacked first deposition part is formed to include a plurality of layers, the color may gradually change at the boundary of each layer. Each of stacked layers may have a different color as well as the different transmittance. In this case, at the boundaries of the stacked layers of the first deposition part, colors are not changed such that the different colors are discretely and divisionally changed to clearly distinguish the boundaries, but may be gradually changed. As described above, in order to gradually change the transmittance, the present invention may use a plurality of raw gas injection inlets and stacks the layers by changing the injection inlets.

According to an example of the present invention, unlike the first deposition part, even though the second deposition part is provided to form a plurality of layers, the boundaries between the layers are clearly distinguished. Further, when the second deposition part is formed by a plurality of layers, at the boundary between the layers of the second deposition part, the transmittance may discretely change.

According to an example of the present invention, prior to the step of forming the regeneration part, a step of washing the damaged portion of the prepared SiC edge ring may be further included.

In the washing step, surface impurities of the prepared SiC edge ring may be removed. In the present invention, a method of the washing step or a device used therefor are not specifically limited.

The washing step provided by an aspect of the present invention may be performed by a clearly different method from a processing process which generally performs the cutting or the planarization. The damaged portion of the SiC edge ring etched by the plasma may have an irregular uneven surface. During the washing step, the surface impurities are removed so that at least the chemical vapor deposition is effectively performed to closely form the uneven surface. The process is easy and requires a short time as compared with the processing process which performs the cutting or the planarization.

According to an example of the present invention, the washing step may include at least any one selected from the group consisting of dry thermal washing, blast washing, brushing washing, cleansing solution injection washing, chemical washing, and ultrasound washing.

According to an aspect of the present invention, the cleansing solution may use an acidic or basic solution.

According to an example of the present invention, during the step of forming the regeneration part, the deposition may be performed in an area including the damaged portion of the prepared SiC edge ring.

One of important features of the present invention is to form a regeneration part by covering the deposition material directly on the damaged portion of the SiC edge ring prepared in the step of forming the regeneration part. That is, the regeneration part is deposited on the damaged portion as it is in a damaged state. As a result, the boundary surface of the damaged portion and the regeneration part formed thereon may be damaged, that is, may be an uneven surface and a vertical cross-section may be identified as an irregular line.

According to an example of the present invention, the step of forming the regeneration part may be performed in a processing process free state of the prepared SiC edge ring.

That is, the present invention does not include the processing step prior to the step of forming the regeneration part. According to an aspect of the present invention, even though a process of processing a damaged portion is not specifically included, the SiC edge ring which may be used in the plasma treatment device may be effectively formed. Therefore, the regeneration part of the present invention may be formed in the damaged portion by the plasma as it is.

According to an example of the present invention, the step of forming the regeneration part (second deposition part) may include the forming of the regeneration part on the uneven surface of the damaged portion.

According to an example of the present invention, the masking step may include masking by a jig.

During the masking step, the masking may be performed by a jig which is capable of supporting at least a part of the SiC edge ring. The jig may include a reference jig which supports a bottom surface among non-damaged surfaces of the damaged SiC edge ring and the other surface jig which supports the other damaged surfaces of the damaged SiC edge ring.

According to an example of the present invention, the masking step performs masking to include a non-damaged portion of one or more surfaces selected from the group consisting of a bottom surface, an outer side surface, and an inner side surface of the SiC edge ring.

That is, the jig may support a bottom surface, an outer side surface, and an inner side surface which may have a non-damaged portion of the SiC edge ring and in this case, the jig may include a reference jig which supports the bottom surface and the other surface jig (an inner side surface jig and an outer side surface jig). The reference jig and the other surface jig may have separated structures (see FIG. 7B) or an integrated structure (see FIG. 9C).

According to an example of the present invention, after the step of removing the masking and standardizing the SiC edge ring in which the regeneration part is formed, a step of finish-washing the SiC edge ring may be further included.

The finish-washing step is a step of finally washing the SiC edge ring after removing the masking and standardizing the SiC edge ring in which the regeneration part is formed.

According to an example of the present invention, the finish-washing step may include a first physical or chemical washing step, a thermal washing step, and a second physical or chemical washing step. Even though the first and second physical or chemical washing steps are not specifically limited in the present invention, a pure solution containing acid, base, distilled water, or an ultrasonic wave may be used. This is performed to remove the impurities remaining on the surface of the SiC edge ring. The thermal washing step is a process performed to allow the remaining impurities which are not washed during the first physical or chemical washing step to be washed during the second physical or chemical washing step by increasing the temperature.

According to an example of the present invention, the thermal treatment temperature of the thermal washing step may be 800° C. to 1400° C. In consideration of the deposition material, the thermal treatment temperature allows the remaining impurities which are not washed by the first physical or chemical washing step to be additionally washed. When the thermal treatment temperature is below 800° C., the remaining impurities may not be in a sufficiently washable state. When the thermal treatment temperature exceeds 1400° C., due to the process design for forming an excessive high temperature, the unit price of the production may be undesirably increased.

According to an example of the present invention, the step of forming the regeneration part may include a step of identifying an etched thickness of the plasma-damaged portion and a step of forming the regeneration part to have a thickness which is 120% to 400% of a maximum value of the etched thickness.

According to an aspect of the present invention, in the step of forming the regeneration part, it is important to form the regeneration part with an appropriate thickness to determine an efficiency of the process. When the regeneration part is formed to be too thin, the entire regeneration part is etched by the plasma so that the damaged portion of the non-generation part therebelow may be exposed. This may be a direct cause of lowering a quality of a semiconductor product produced by the plasma treatment technique. Further, when the regeneration part is formed to be too thick, raw gas which forms the regeneration part are wasteful and the cost and efforts for the processing is increased to finally increase a unit price of the semiconductor product and lower the production efficiency. Therefore, in one aspect of the present invention, it is an important factor to appropriately control the thickness of the regeneration part.

According to an aspect of the present invention, during the step of forming the regeneration part, an etched thickness of the SiC edge ring including a plasma-damaged portion as compared with a thickness of the original SiC edge ring is checked first and the regeneration part may be formed to have a thickness which is 120% to 400% of the maximum value of the etched thickness of the damaged portion.

As described above, when the regeneration part to be formed has a thickness which is lower than 120% of the maximum value of the etched thickness, there may be a problem in that the uneven surface of the damaged portion may be exposed by the plasma again. Further, when it is considered that the SiC edge ring is regenerated before exposing the base material in use or the boundary between the deposition layers by the plasma etching, if the regeneration part to be formed has a thickness which exceeds 400% of the maximum value of the etched thickness, an excessively thick regeneration layer is formed. Therefore, a thickness which needs to be processed for standardization is increased, which may deteriorate the regeneration efficiency.

Although the exemplary embodiments have been described above by a limited embodiment and the drawings, various modifications and changes may be made from the above description by those skilled in the art. For example, even when the above-described techniques are performed by different order from the described method and/or components described above are coupled or combined in a different manner from the described method or replaced or substituted with other components or equivalents, the appropriate results may be achieved.

Therefore, other implements, other embodiments, and equivalents to the claims are within the scope of the following claims.

The invention claimed is:

1. A SiC edge ring, comprising:
   a first deposition part having a plasma-damaged portion and a non-damaged portion and comprising SiC;
   a second deposition part formed on the first deposition part and comprising SiC,
   wherein a boundary between the damaged portion of the first deposition part and the second deposition part includes a first uneven surface; and
   a third deposition part formed on the second deposition part,
   wherein a boundary surface between the second deposition part and the third deposition part includes a second uneven surface.

2. The SiC edge ring according to claim 1, wherein at least one of the first or the second uneven surface is formed by plasma-etching.

3. The SiC edge ring according to claim 1, wherein a height difference between a highest point and a lowest point of at least one of the first or the second uneven surface formed from a portion having the same height before being exposed to the plasma to be damaged, in the at least the first or the second uneven surface, is 0.5 mm to 3 mm.

4. The SiC edge ring according to claim 1, wherein a surface roughness of at least one of the first or the second uneven surface is 0.1 µm to 2.5 µm.

5. The SiC edge ring according to claim 1, wherein the first deposition part and the second deposition part have different transmittances.

6. The SiC edge ring according to claim 1, wherein the first deposition part includes one or more selected from the group consisting of graphite, reaction sintered SiC, normal-pressure sintered SiC, hot press SiC, recrystallized SiC, CVD SiC, TaC, and YaC.

7. The SiC edge ring according to claim 6, wherein a difference in transmittances between the first deposition part and the second deposition part is larger than a difference in transmittances between a plurality of stacked layers in the second deposition part.

8. The SiC edge ring according to claim 1, wherein the first deposition part includes a plurality of stacked layers and transmittance gradually changes at the boundary between the plurality of stacked layers of the first deposition part.

9. The SiC edge ring according to claim 1, wherein the first deposition part, the second deposition part, and the third deposition part have different transmittances, and the third deposition part formed on the second deposition part is further included and in a cross-section of the reproduced SiC edge ring, a boundary line between the first deposition part and the second deposition part and a boundary line between the second deposition part and the third deposition part include a section in which the boundary lines are parallel.

10. The SiC edge ring according to claim 1, wherein the first deposition part includes at least two separated structures.

11. The SiC edge ring according to claim 1, wherein the second deposition part includes at least two separated structures.

12. The SiC edge ring according to claim 11, wherein the at least two separated structures have the same transmittance.

13. The SiC edge ring according to claim 10, wherein the at least two separated structures have the same transmittance.

14. The SiC edge ring according to claim 1, wherein the first deposition part forms one structure which is not separated, a cross-section of the first deposition part includes a first region to a third region from an outer side surface of the SiC edge ring to an inner side surface, and an average thickness t1 of the first region, an average thickness t2 of the second region, and an average thickness t3 of the third region is t1>t3>t2.

15. The SiC edge ring according to claim 1, wherein an average thickness of the second deposition part is 0.5 mm to 3 mm.

16. The SiC edge ring according to claim 1, wherein at least one of the first or the second uneven surface is subjected to a surface processing treatment before forming the second deposition part.

* * * * *